(12) United States Patent
Eplett

(10) Patent No.: US 8,947,164 B2
(45) Date of Patent: Feb. 3, 2015

(54) INTEGRATED TECHNIQUE FOR ENHANCED POWER AMPLIFIER FORWARD POWER DETECTION

(71) Applicant: Microsemi Corporation, Aliso Viejo, CA (US)

(72) Inventor: Brian Eplett, Lilburn, GA (US)

(73) Assignee: Microsemi Corporation, Aliso Viejo, CA (US)

( * ) Notice: Subject to any disclaimer, the term of this patent is extended or adjusted under 35 U.S.C. 154(b) by 92 days.

(21) Appl. No.: 13/894,221

(22) Filed: May 14, 2013

(65) Prior Publication Data

US 2013/0307624 A1    Nov. 21, 2013

Related U.S. Application Data

(60) Provisional application No. 61/648,721, filed on May 18, 2012.

(51) Int. Cl.
| | |
|---|---|
| *H03G 3/10* | (2006.01) |
| *H03G 3/00* | (2006.01) |
| *H03F 1/56* | (2006.01) |
| *H03F 3/19* | (2006.01) |

(52) U.S. Cl.
CPC ............. *H03G 3/004* (2013.01); *H03F 1/56* (2013.01); *H03F 3/19* (2013.01)
USPC .......................................... 330/278; 330/129

(58) Field of Classification Search
USPC .................................. 330/278, 279, 129, 136
See application file for complete search history.

(56) References Cited

U.S. PATENT DOCUMENTS

| | | | |
|---|---|---|---|
| 5,148,117 A | 9/1992 | Talwar | |
| 5,977,831 A * | 11/1999 | Davis et al. | ............... 330/279 |
| 7,777,566 B1 * | 8/2010 | Drogi et al. | ............... 330/136 |
| 2006/0222104 A1 | 10/2006 | Braithwaite | |
| 2011/0148519 A1 * | 6/2011 | Drogi et al. | ............... 330/129 |

FOREIGN PATENT DOCUMENTS

EP    0803974 A1    10/1997

OTHER PUBLICATIONS

European Patent Office, ISA/EP, International Search Report/Written Opinion, PCT/US2013/041202, Rijswijk, The Netherlands, Nov. 29, 2013, 7 pages.

* cited by examiner

*Primary Examiner* — Henry Choe
(74) *Attorney, Agent, or Firm* — Marger Johnson & McCollom, PC

(57) ABSTRACT

A power amplifier has power detection capabilities that include a radio frequency (RF) power amplifier that has a gain stage that includes a gain stage input, a gain stage output, and a feedback loop coupled between an input and an output of the power amplifier. A detection circuit has a first detection circuit input electrically coupled to the gain stage input and has a detection circuit output. An amplitude control circuit and a phase control circuit are electrically coupled together in series between the gain stage output and a second detection circuit input. The amplitude control circuit and the phase control circuit produce a signal that is received by the second detection circuit input so that the detection circuit can detect a signal at the detection circuit output that is proportional to a the forward power output of the power amplifier and is insensitive to power amplifier output load mismatch.

17 Claims, 10 Drawing Sheets

INTEGRATED TECHNIQUE FOR ENHANCED POWER AMPLIFIER FORWARD POWER DETECTION

CROSS REFERENCE TO RELATED APPLICATIONS

This application claims the benefit of U.S. provisional patent application Ser. No. 61/648,721, filed May 18, 2012, incorporated by reference herein.

FIELD OF THE INVENTION

This disclosure relates to enhancing power amplifier performance and more specifically to improving the forward power detection under variable loading conditions caused by the environment.

BACKGROUND OF THE INVENTION

Many power amplifiers are used in environments in which the amount of power of the transmitted signal must be within a specified range. For example, federal agencies like the Federal Communications Commission (FCC) restrict the amount of power permissible in a signal transmitted in wireless LAN communications. Power detection in circuits that include power amplifiers in such controlled environments is critical to ensuring that the power of the transmitted signals are compliant with FCC regulations.

Accurate power detection in power amplifiers can be challenging, especially when the load condition on the output of the power amplifier changes over time, such as when the user of a cell phone moves from outside of a building to inside of a building. The performance of the power amplifier changes with the new loading condition, and this performance change must be reliably detected. Existing solutions for detecting power in power amplifiers can rely on printed circuit board (PCB) level directional couplers that are large and costly. Other existing solutions rely on power detection at the output of the power amplifier, which produces a significant amount of variation for detecting the forward power. Still other existing solutions rely on power detection at the input of the final gain stage of the power amplifier, but such an arrangement suffers from a dependent relationship between the power amplifier design and the detector and requires the power amplifier design to consider the design parameters of the detector, which limits the power amplifier capabilities.

Therefore, there is a need for improvements to power detection in power amplifiers that can be integrated in monolithic solutions, such as a standard CMOS/BiCMOS or GaAs process, that can be independent of power amplifier design parameters and provide a degree of freedom from the performance of the power amplifier without sacrificing the ability to accurately detect power in the output signal of the power amplifier.

SUMMARY OF THE INVENTION

An object of this invention is to provide methods and device structures suitable for improving the forward power detection of a power amplifier.

An exemplary power amplifier has power detection capabilities. Such devices and methods can include a radio frequency (RF) power amplifier that has a gain stage that includes a gain stage input, a gain stage output, and a feedback loop coupled between an input and an output of the power amplifier. A detection circuit has a first detection circuit input that is electrically coupled to the gain stage input and a detection circuit output. An amplitude control circuit and a phase control circuit are electrically coupled together in series between the gain stage output and a second detection circuit input. The amplitude control circuit and the phase control circuit produce a signal that is received by the second detection circuit input so that the detection circuit can detect a signal at the output of the detection circuit that has a power proportional to a forward power output of the power amplifier.

A method of detecting forward power in a detection circuit that is coupled to a power amplifier is also disclosed. A first amplitude control circuit is coupled in series to an input of a gain stage of a power amplifier to produce a corrected input signal. A second amplitude control circuit and a phase control circuit are coupled in series to an output of the gain stage of the power amplifier to produce a corrected output signal. The corrected input signal and the corrected output signal are summed to produce a summed node signal that is proportional to the forward power output of the power amplifier. The summed node signal is applied to the detection circuit to detect the forward power output of the power amplifier.

The foregoing and other objects, features and advantages of the invention will become more readily apparent from the following detailed description of embodiments of the invention which proceeds with reference to the accompanying drawings.

DETAILED DESCRIPTION

Figure 1:
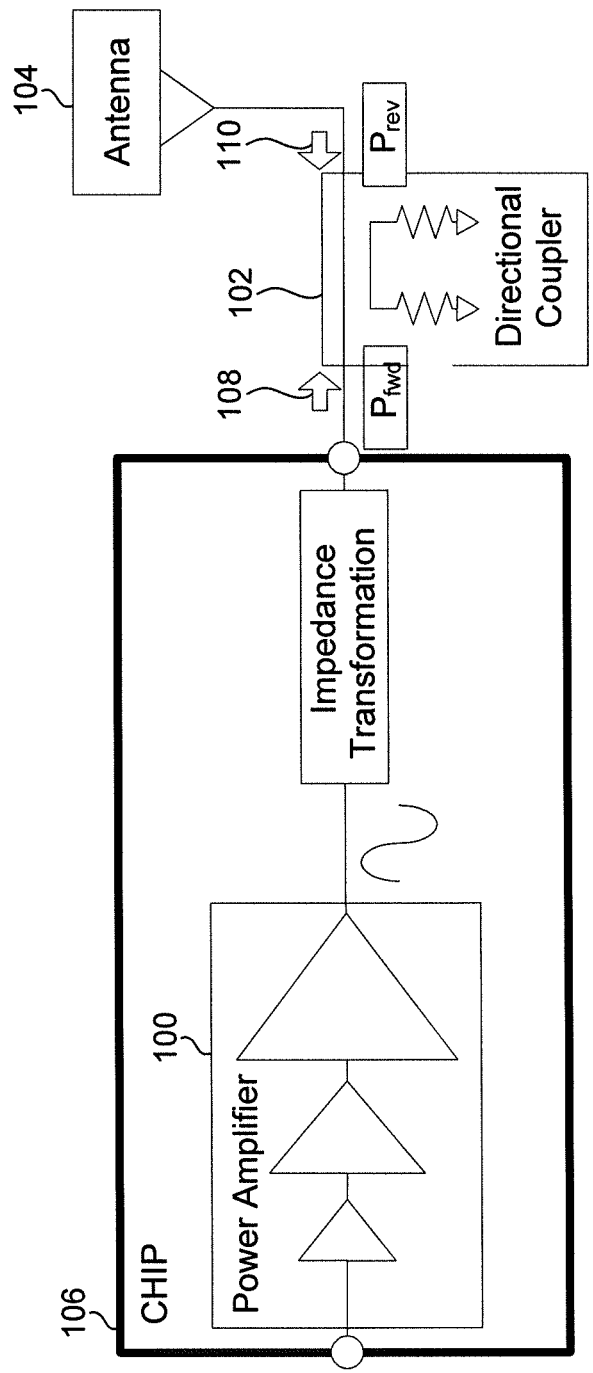
FIG. 1 is a prior art power detection circuit for use with a power amplifier under matched power conditions.

In the drawings, which are not necessarily to scale, like or corresponding elements of the disclosed systems and methods are denoted by the same reference numerals.

To detect power in power amplifiers, such as those in the LX5586 and LX5588 Integrated Front End Modules manufactured by Microsemi Corporation®, the disclosed circuits and methods provide for an integrated power detection solution that provides design freedom from the power amplifier. The disclosed power amplifiers with integrated power detectors minimize power loss, have a flat frequency response, improved directivity, can be integrated alongside and independently from the power amplifier, and are physically small to conserve die area. All of these features of the disclosed power amplifiers with integrated power detectors improve the size and cost of power detection for power amplifiers. The circuits and methods of the disclosure sample the input and output of the final stage of a power amplifier to accurately detect power in the signal transmitted from the power amplifier.

Figure 2:
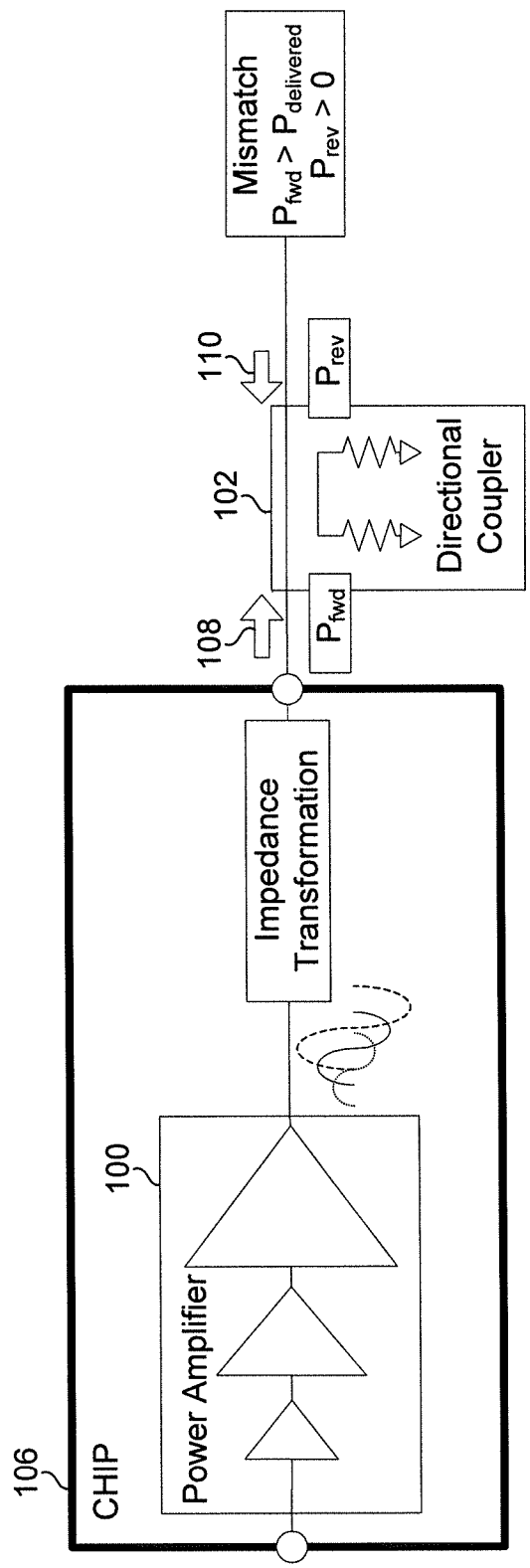
FIG. 2 is the prior art power detection circuit shown in FIG. 1 under mismatched power conditions.

FIGS. 1-5 show prior art solutions to detecting power in power amplifiers. FIGS. 1 and 2 show a prior art power amplifier 100 with a directional coupler 102 that detects the power of the signal being transmitted from the power amplifier 100 through the antenna 104 under matched and mismatched signal conditions, respectively. In the prior art power detector shown in FIGS. 1 and 2, the directional coupler 102 and antenna 104 are located off of the integrated circuit die or chip 106. Under the matched conditions shown in FIG. 1, the voltage standing wave ratio (VSWR) is zero. Under the mismatched conditions shown in FIG. 2, the VSWR is greater than zero. Calculating the VSWR is a ratio of the maximum and minimum radio frequency (RF) voltage amplitude on the transmission path. The variation in voltage amplitude is caused by non-zero reflected power ($P_{rev}$). This reverse power is caused by load mismatch on the output of the power amplifier, which reflects the forward power back toward the power amplifier.

A matched signal is a signal that has forward power, $P_{fwd}$, 108 that is equal to the power delivered to the load (i.e., the antenna that transmits the signal from the power amplifier). Under these conditions, the reflected power, $P_{rev}$, 110 is zero. Forward power, $P_{fwd}$, 108 is the power of the signal that is being transmitted from the power amplifier 100 through the antenna 104. Reflected power, $P_{rev}$, 110 is the power that is being reflected due to load match from the antenna 104 back toward the amplifier. Reflected power, $P_{rev}$, 110 is generated when a signal is returned by the antenna 104, which often occurs when signals are transmitted in areas in which signals are likely to reflect off of an object, such as a metal box, building, vehicle, or the like.

FIG. 2 shows the prior art power detection solution in which the forward power, $P_{fwd}$, 108 is no longer equal to the power delivered to the load. Some amount of the power is reflected, depending on the degree of mismatch. Under these conditions, $P_{rev}$ longer zero. Such mismatched conditions cause voltage amplitude variation in the transmission path and makes the forward power, $P_{fwd}$, 108 no longer proportional to the voltage amplitude of the power signal output from the power amplifier. This variation prevents accurate power detection in a voltage detection-based solution. Variation in the phase and magnitude of the mismatch makes accurately detecting the forward power, $P_{fwd}$, 108 difficult since integrated detection schemes are most easily realized in the voltage domain.

In the presence of mismatch, the voltage signal at any given location in the system varies in phase as well as amplitude. The prior art detectors shown in FIGS. 1 and 2 rely on only sampling the output voltage, which makes this solution inherently inaccurate because the forward power, $P_{fwd}$, 108 is no longer proportional to the voltage amplitude of the power of the output signal from the power amplifier.

Figure 3:
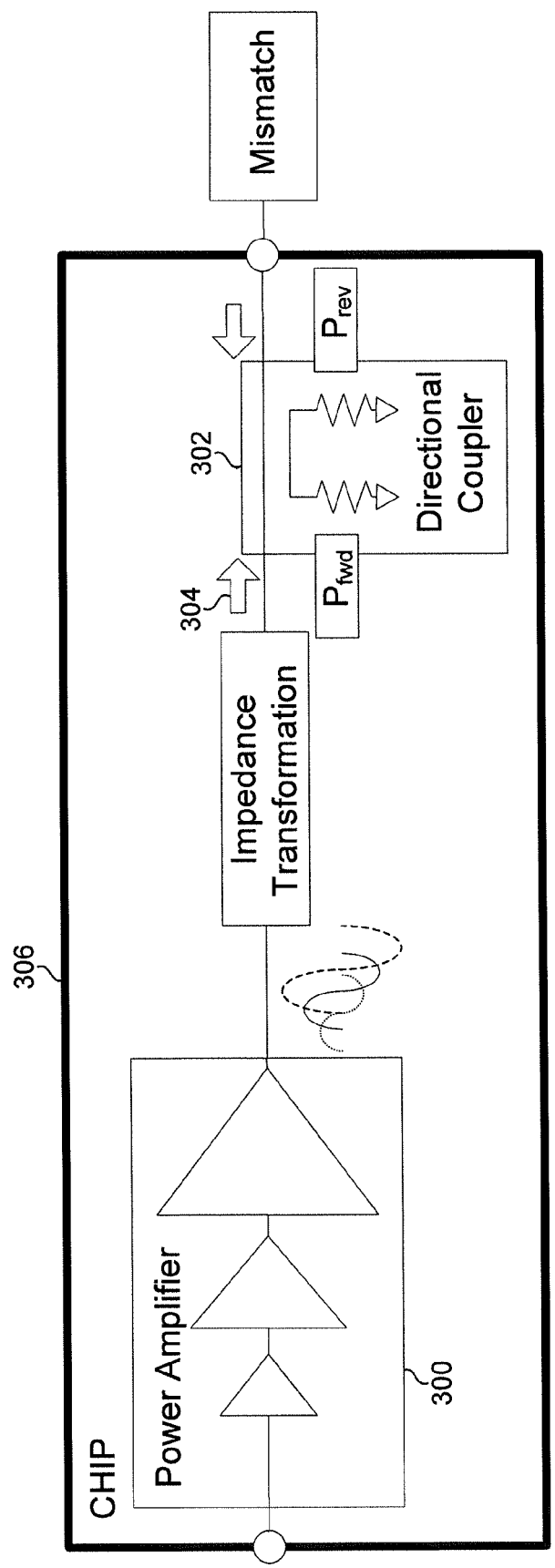
FIG. 3 is a prior art integrated forward power detection circuit with an external directional coupler under mismatched conditions.

FIG. 3 shows a prior art power amplifier that implements an external on-chip directional coupler 302 that detects forward power, $P_{fwd}$, 304 output by the power amplifier 300 all on the same chip 306. The amplitude and frequency response of the signal detected by the directional coupler 302 is a direct function of the size of the on-chip directional coupler 302. As the size of the directional coupler 302 grows, the loss of the structure increases and the area cost of the on-chip solution increases. The behavior of the directional coupler 302 is dictated by the wavelength of the signal, the directional coupler 302 can experience a significant trade-off between frequency response and size, which translates into loss. Further, this prior art on-chip directional coupler 302, is intimately tied to the behavior of the power amplifier 300, which complicates the design of the power amplifier 300 and compromises power amplifier performance for detector or directional coupler performance.

Figure 4:
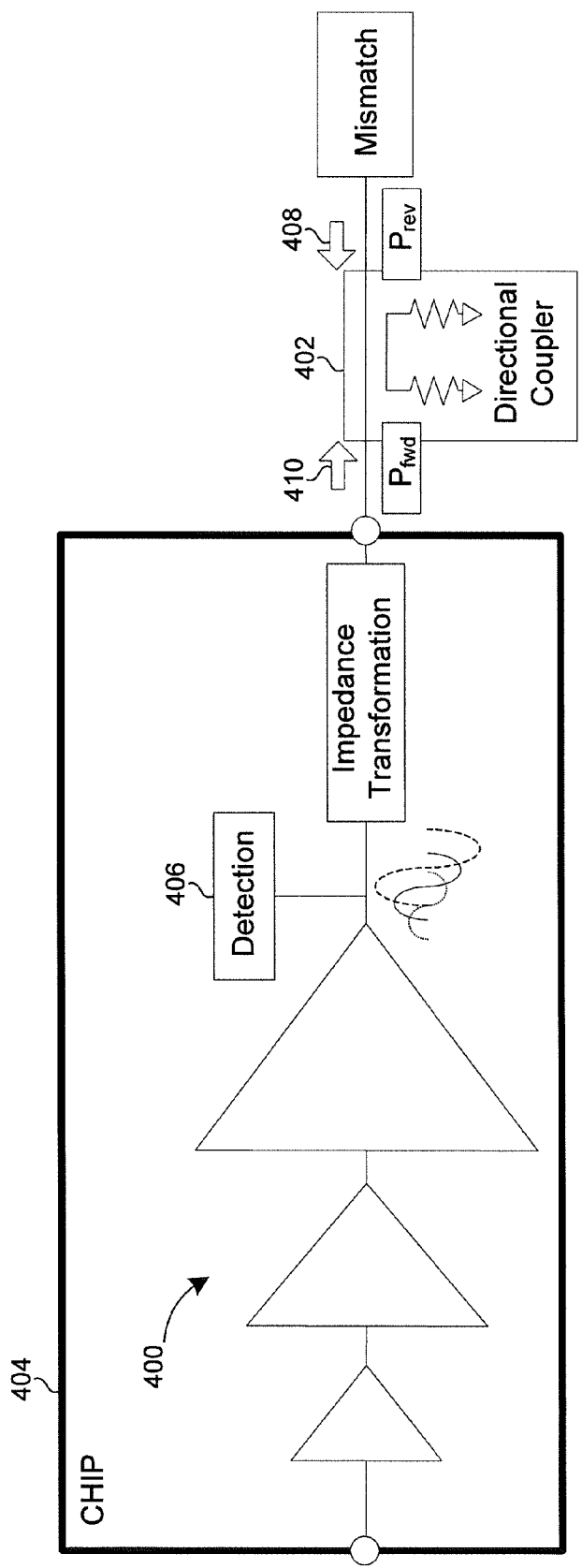
FIG. 4 is a prior art integrated forward power detection circuit with a detection circuit that detects voltage at the output of the power amplifier under mismatched conditions.

FIG. 4 shows another prior art power amplifier 400 with a power detector 402 in which a directional coupler 402 is located off the chip 404 on which the power amplifier 400 is located. The power from the power amplifier 400 in the example shown in FIG. 4 is detected at the output of the power amplifier 400. As described above, the reflected power, $P_{rev}$, 408 interacts with the forward power, $P_{fwd}$, 410 such that the voltage amplitude at a given point between the power amplifier 400 output and the mismatch causes the voltage amplitude to vary. Detection of the voltage on the power amplifier 400 output produces a significant amount of variation for a constant forward power, $P_{fwd}$ 410.

Figure 5:
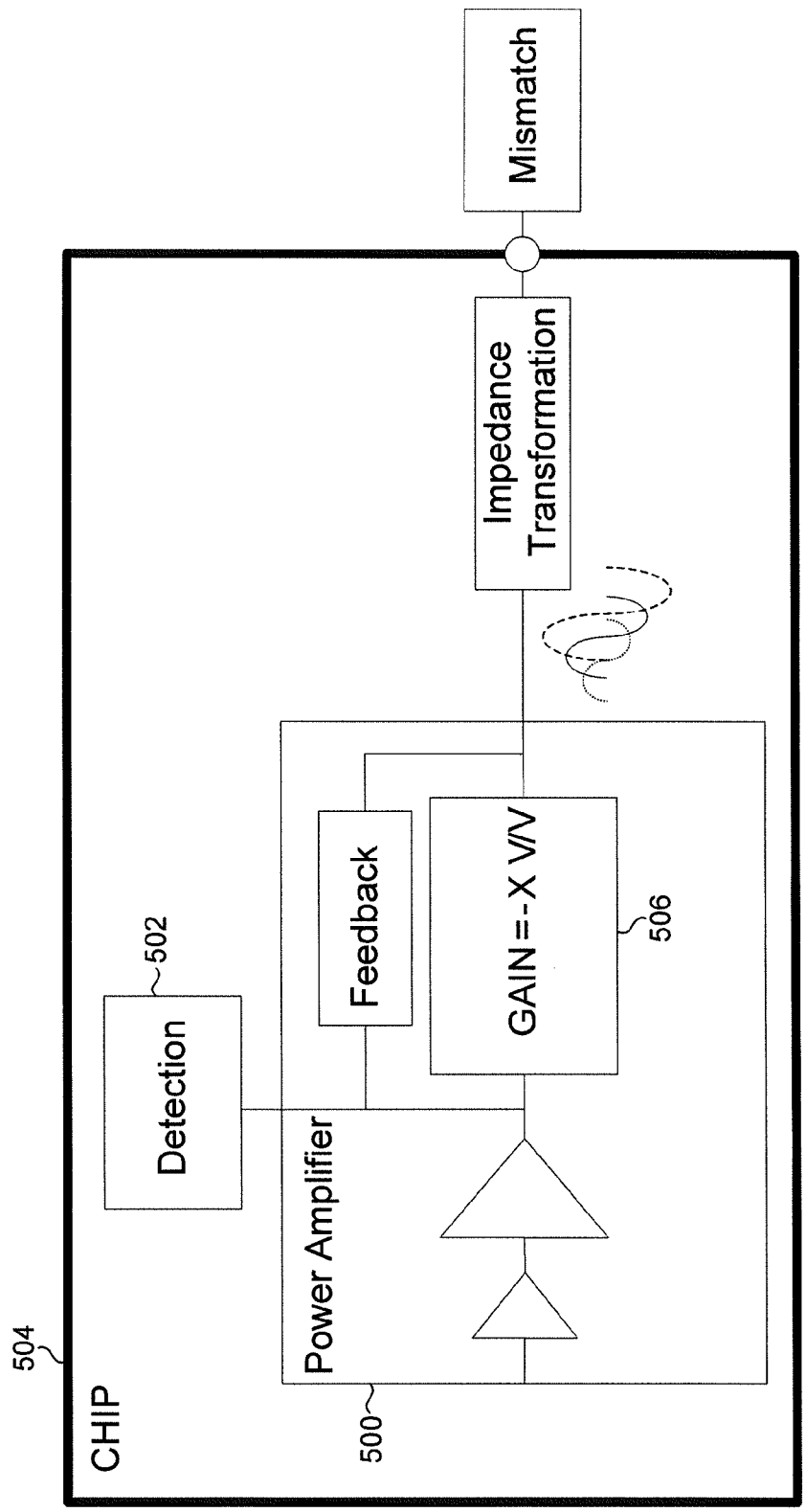
FIG. 5 is a prior art integrated forward power detection circuit with a detection circuit that detects voltage on the input of the final gain stage of the power amplifier under mismatched conditions.

FIG. 5 shows yet another prior art power amplifier 500 with a power detector 502 located on the same chip 504. The power detector 502 detects power, on-chip, at the input of a final gain stage 506 of the power amplifier 500 without need for a directional coupler, as shown in the prior art examples described above in reference to FIGS. 1-4. The input of the final gain stage 506 of the power amplifier 500 is less sensitive to mismatched signals because transistors in the final stage of the power amplifier have a negative voltage gain and a finite reverse isolation so the impact of VSWR due to mismatched signals can be diminished. However, a detector design that detects power at the input of the final gain stage of the power amplifier, such as the detector 502 shown in FIG. 5, suffers from a dependence upon the power amplifier design, a reduced ability to control the phase and amplitude mismatch that may be seen at the input of the final gain stage of the power amplifier, and a reduced ability to detect signals with relatively low power values.

Figure 6:
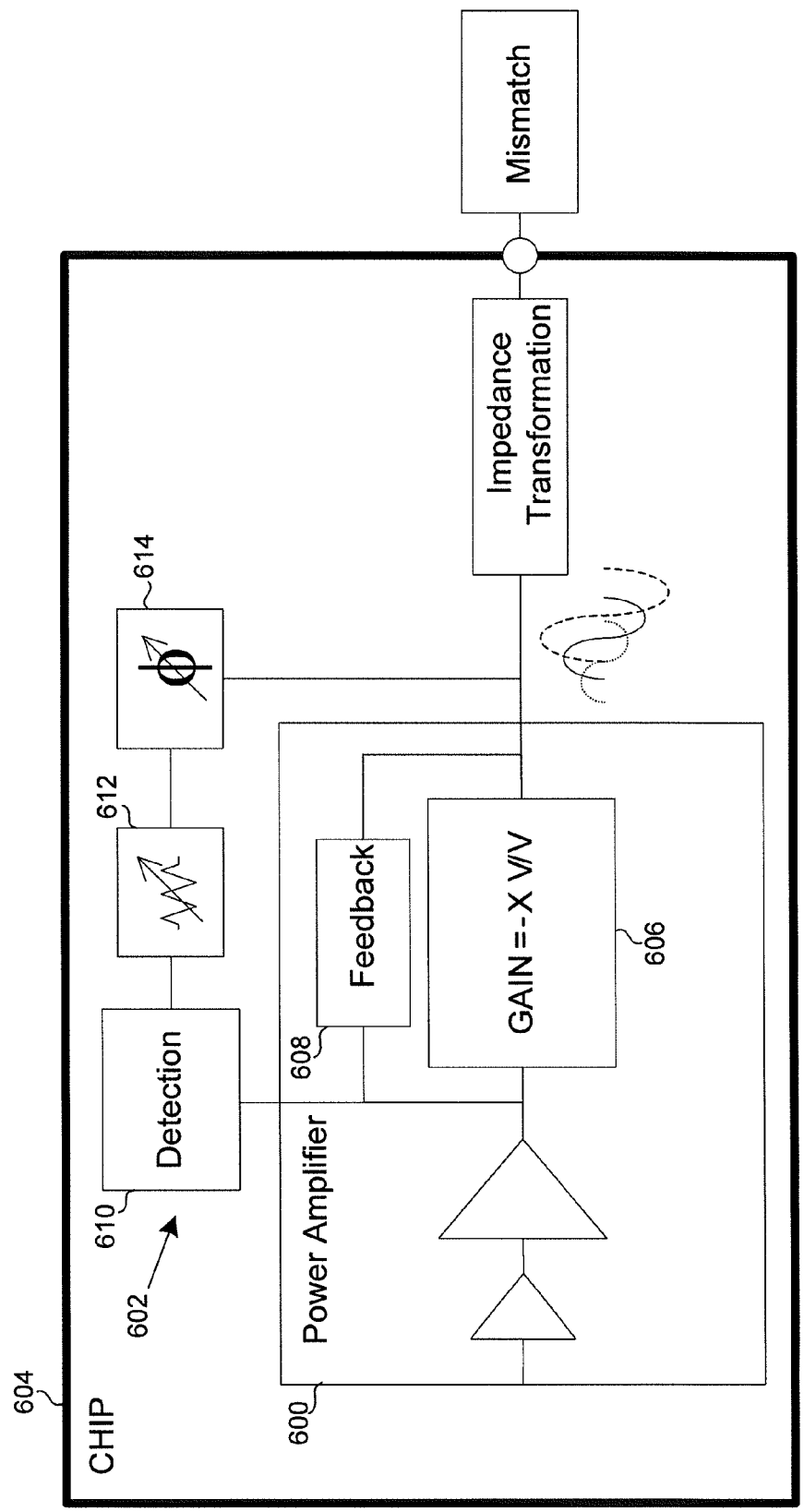
FIG. 6 is an integrated forward power detector in accordance with aspects of the disclosure.
Figure 7:
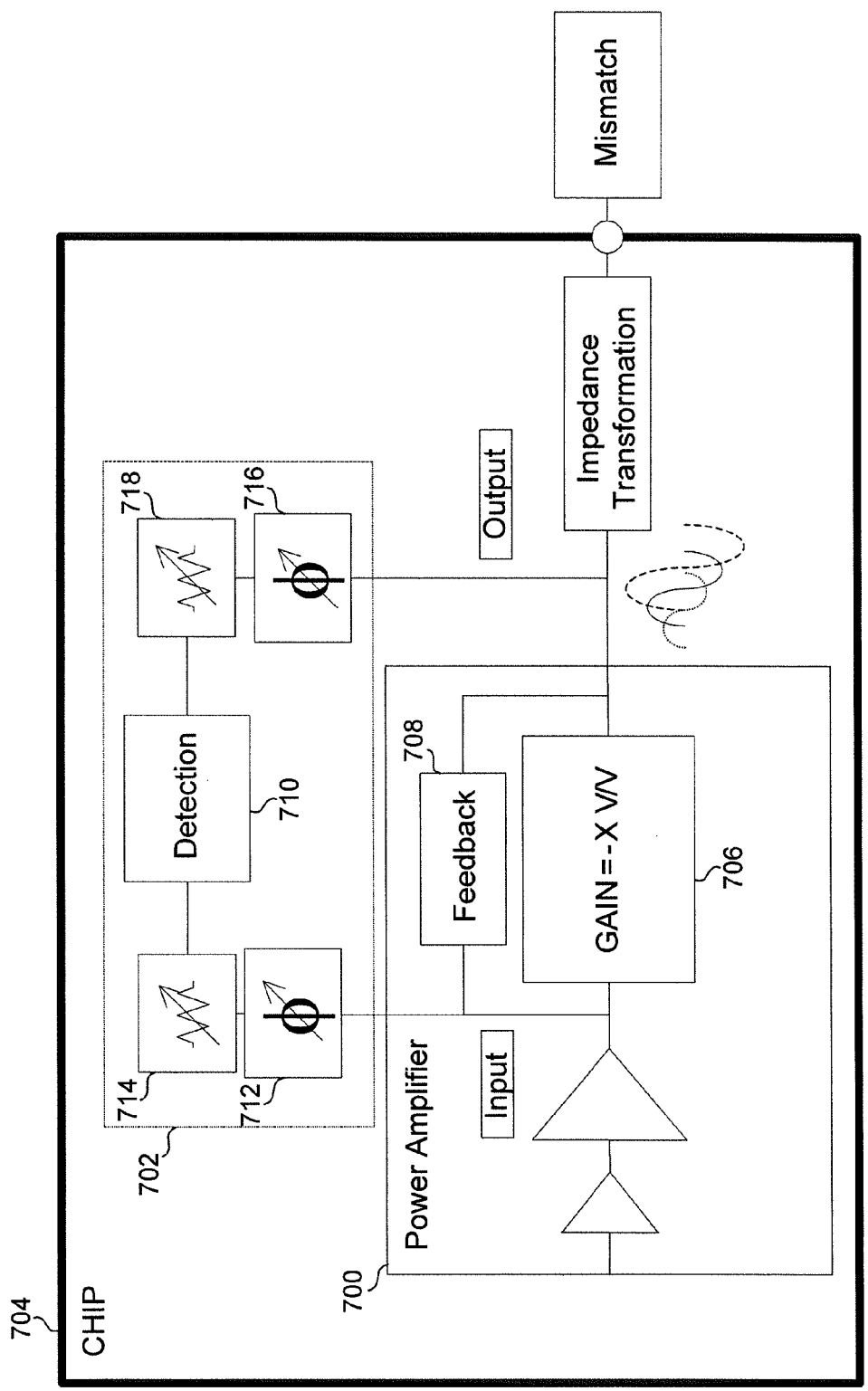
FIG. 7 is another embodiment of an integrated forward power detector in accordance with aspects of the disclosure.

Turning now to FIGS. 6 and 7, two power amplifiers with power detectors are disclosed that detect power of a signal output from a power amplifier, in accordance with aspects of the disclosure. In FIG. 6, the power amplifier 600 and the detector 602 are both located on the same chip 604. The power amplifier 600 can be a radio frequency RF power amplifier with multiple gain stages, including a final gain stage 606. The final gain stage 606 of the power amplifier 600 has an input and an output and a feedback loop 608 is coupled between the input and output of the power amplifier 600. The detector 602 includes a detection circuit 610 that has a detection circuit input that is electrically coupled to the final gain stage 606 input of the power amplifier 600 and has a detection circuit output (840 in the FIG. 8 example). An amplitude control circuit 612 and a phase control circuit 614 that are electrically coupled between the final gain stage 606 output and a second detection circuit 610 input. The amplitude control circuit 612 and phase control circuit 614 are electrically coupled in series and their order can be reversed in other examples. The amplitude control circuit 612 and the phase control circuit 614 produce a signal that is received by the second detection circuit 610 input so that the detection circuit 610 produces an output signal that is proportional to the forward power output of the power amplifier 600.

The detection circuit 610 of the power amplifier 600 shown in FIG. 6 can be independent of the power amplifier 600 design parameters, which produces VSWR insensitive forward power detection in the power amplifier 600 output signal. The signal detected by the detection circuit 610 input on the input of the final gain stage 606 of the power amplifier 600 and the output signal that has been corrected for both amplitude and phase signal mismatch by the amplitude control circuit 612 and the phase control circuit 614 are summed in the detection circuit 610 independently of the performance characteristics inherent in the power amplifier 600. The detection circuit 610 operates separately from the power amplifier 600 in this example.

FIG. 7 shows another embodiment of a power amplifier 700 with a power detector 702 that detects power of a signal output from the power amplifier 700, in accordance with aspects of the disclosure. Similar to FIG. 6, the power amplifier 700 and the detector 702 are both located on the same chip 704. In this example, a final gain stage 706 of the power amplifier 700 has an input and an output and a feedback loop 708 coupled between the input and output. The detector 702 includes a detection circuit 710 that has a detection circuit input that is electrically coupled to a first phase control circuit 712 and a first amplitude control circuit 714. The input to the first phase control circuit 712 and the first amplitude control circuit 714 is electrically coupled to the input of the final gain stage 706 of the power amplifier 700.

The detection circuit 710 also includes a detection circuit output that is electrically coupled to a second phase control circuit 716 and a second amplitude control circuit 718. The output of the second phase control circuit 716 and the second amplitude control circuit 718 is electrically coupled to the output of the final gain stage 706 of the power amplifier 700. The order of both the first and second phase control 712, 716 and amplitude control circuits 714, 718 can be reversed. In a similar manner described above with reference to FIG. 6, the signal produced by the first phase and amplitude control circuits 712, 714 and the signal produced by the second phase and amplitude control circuits 716, 718 are summed in the detection circuit 710 to produce a summed RF signal. The summed RF signal has a power proportional to a forward power output of the power amplifier 700.

The phase control circuit 712 may be omitted while having the amplitude control circuit 714 remain electrically coupled to the final gain stage 706 input. The final gain stage of the power amplifier has an input and an output and a feedback loop coupled between the input and output, as described above. The detector includes a detection circuit that has a detection circuit input that is electrically coupled to a first amplitude control circuit. The input to the first amplitude control circuit is electrically coupled to the input of the final gain stage of the power amplifier. This detection circuit also includes a detection circuit output that is electrically coupled to a phase control circuit and a second amplitude control circuit that are electrically coupled together in series. The output of the phase control circuit and the second amplitude control circuit is electrically coupled to the output of the final gain stage of the power amplifier. The order of the phase and second amplitude control circuits can be reversed. The detection circuit is electrically coupled between a first amplitude control circuit and a combined second amplitude control circuit and a phase control circuit in this example. The gain stage output or the signal output by the power amplifier exhibits a VSWR that is greater than zero in any of the example power amplifiers and detectors described above.

Figure 8:
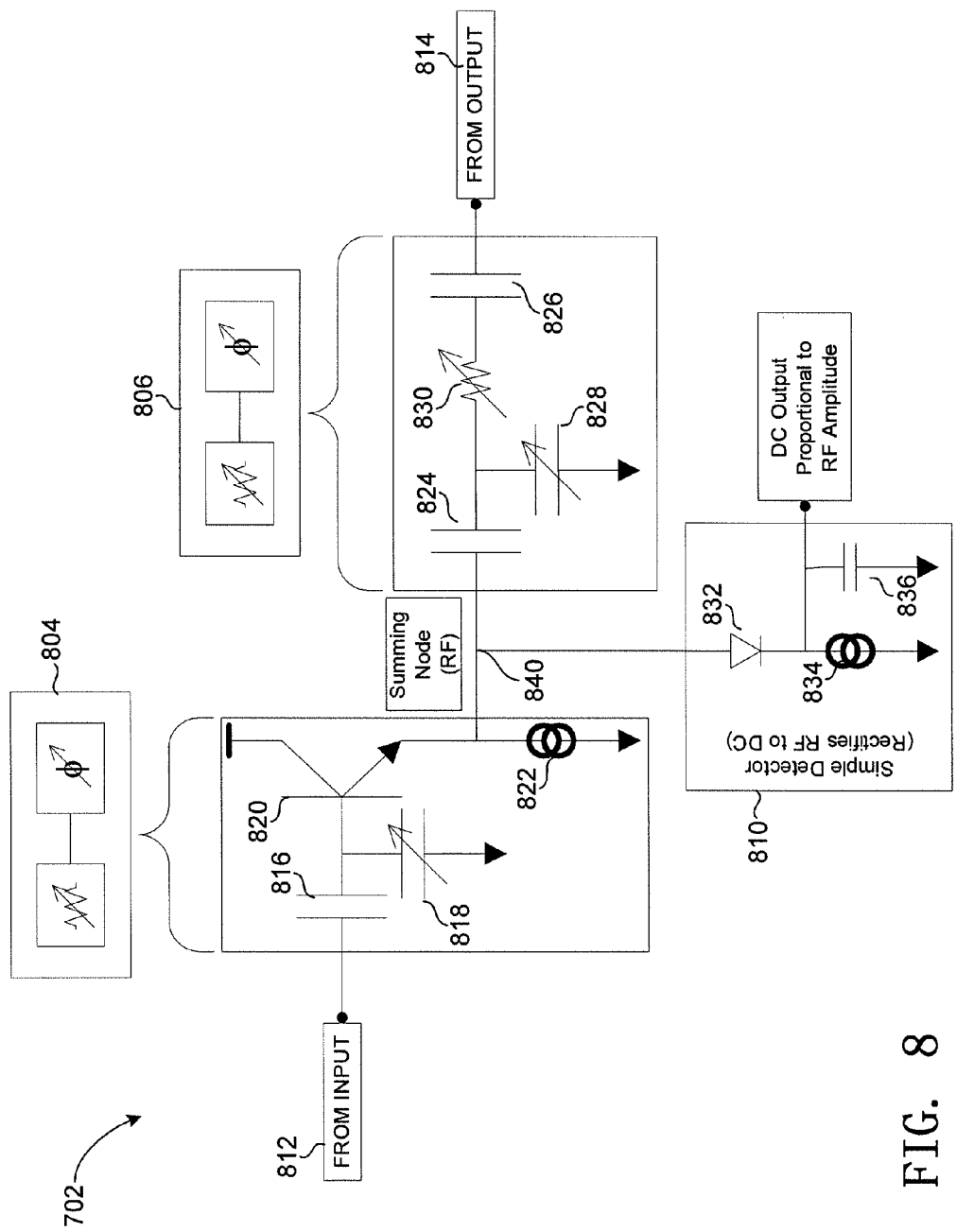
FIG. 8 is an example summing detection circuit electrically coupled to a first amplitude and phase control circuit and a second amplitude and phase control circuit.

Referring now to FIG. 8, an example summing detection circuit is disclosed that illustrates the detector shown in FIG. 7. The summing detection circuit includes a first phase and amplitude control circuit 804, a second phase and amplitude control circuit 806, a summing node 808, and a detection circuit 810. The input to the first phase and amplitude control circuit 804 is electrically coupled to the input 812 of the final gain stage of the power amplifier. The output 814 of the second phase and amplitude control circuit is electrically coupled to the output of the final gain stage of the power amplifier. The first phase and amplitude control circuit 804 includes a capacitor 816, a variable or selectable blocking capacitor 818, a transistor 820, and a current source 822. The second phase and amplitude control circuit 806 includes two capacitors 824, 826, a variable or selectable blocking capacitor 828, and a programmable resistor 830. The output of the first phase and amplitude control circuit 804 is electrically coupled or summed together with the input to the second phase and amplitude control circuit 806 at the summing node 808 of the detection circuit 810. FIG. 8 shows an example of a summing node 808, although summing the output of the first phase and amplitude control circuit 804 and the second phase and amplitude control circuit 806 can be accomplished in various manners.

The detection circuit 702 shown in FIG. 8 includes a rectifier 834, such as a diode or any other circuit element that can transform an RF signal into a DC voltage, a current source 836, and a capacitor 838. The output 840 of the detection circuit 702 is proportional to the RF signal output of the power amplifier. The detection circuit creates a direct current (DC) voltage that is proportional to the amplitude of the RF signal at the summing node 808. The DC voltage produced by the detection circuit 702 is also proportional to the voltage associated with the power of the signal output from the power amplifier. Because the signal is now a low frequency signal, i.e., a DC signal, it can be accurately communicated to other elements of the RF transmission system.

Figure 9:
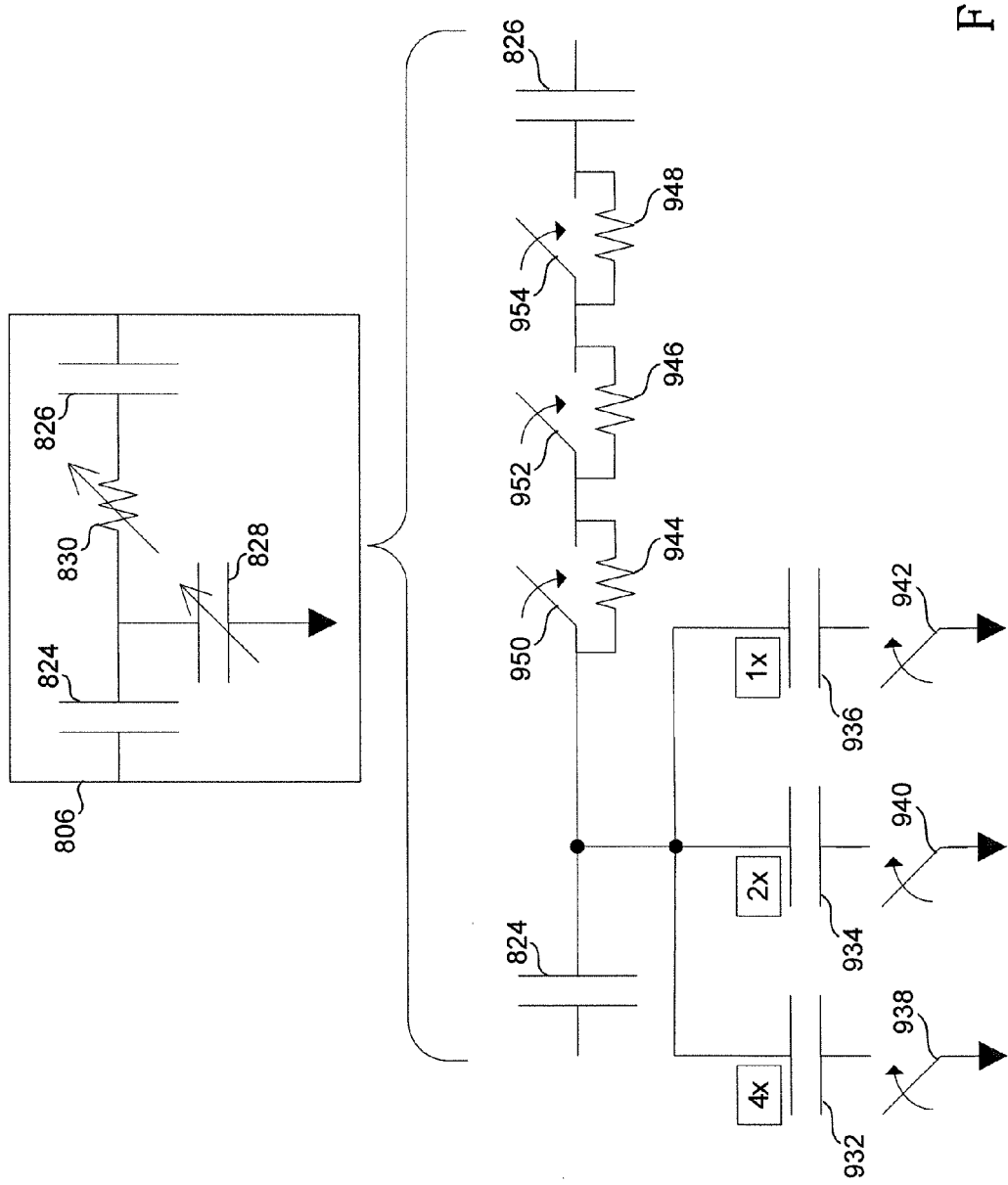
FIG. 9 is an example resistor and capacitor tuning circuit for an amplitude and phase control circuit combination.

FIG. 9 shows an example of the second phase and amplitude control circuit 806 shown in FIG. 8. The blocking capacitor 828 includes a series of three capacitors 932, 934, 936 and respective switches that provide different capacitor values depending on which switches 938, 940, 942 are open and closed. The three capacitors 932, 934, 936 are electrically coupled together in parallel. The programmable resistor 832 includes a series of three resistors 944, 946, 948 and respective switches 950, 952, 954, which can be gate-controlled FETs in some examples. When all of the resistor switches 950, 952, 954 are open, the total resistance equals the sum of the values of all three resistors 944, 946, 948. When all of the resistor switches 950, 952, 954 are closed, the total resistance is the line resistance and the three resistors 944, 946, 948 add no resistance to the circuit. The resistance across the programmable resistor can be varied by opening and closing one or more of the switches 950, 952, 954, as desired. Because of the programmable nature of the phase and amplitude control circuit 806 shown in FIG. 9, the detector can be programmed in response to variations in power of an output signal of the power amplifier. For example, any of the phase and amplitude control circuits discussed above in reference to FIGS. 6-8 can have programmable components that can be programmed in response to variations in power of the output signal of the power amplifier.

Figure 10:
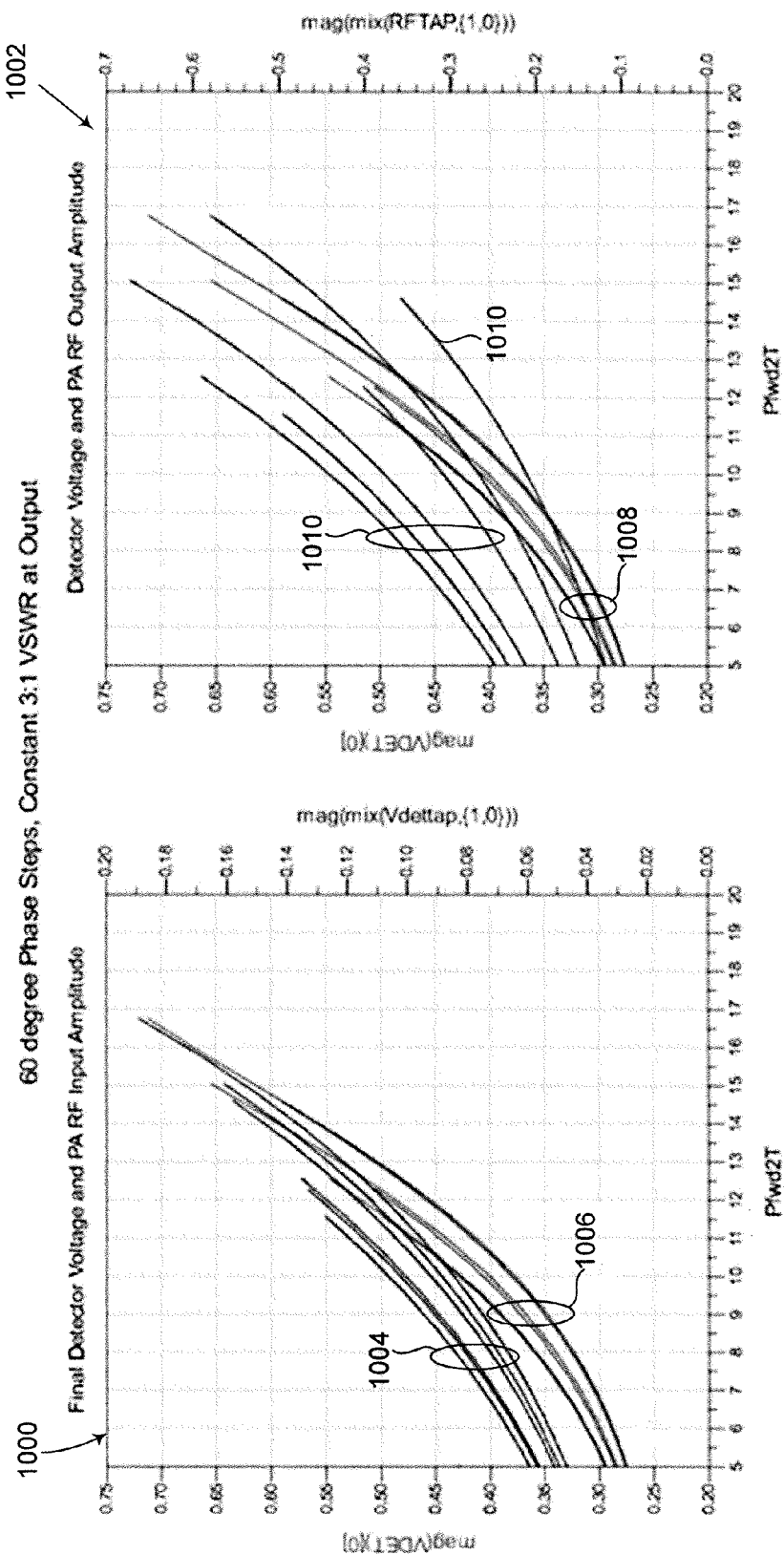
FIG. 10 is a graphical representation of VWSR insensitive forward power detection improvement when the power detection of the power amplifier is performed by the disclosed power detectors.

FIG. 10 shows graphical representations of the performance improvement of forward power detection using the disclosed power amplifiers with power detectors. For each graph, the forward power is sampled along the X-axis and a constant voltage is plotted along the Y-axis. Each line represents a different load condition with a 3:1 VSWR (the magnitude of the mismatch) with a variable phase (60 degree steps). The first graph 1000 shows the final detector response to forward power and represents the amplitude of the RF signal input to the final gain stage of the power amplifier. The second graph 1002 represents the amplitude of the RF output voltage signal. The output voltage signal has much higher amplitude and greater variation for the same forward power than the amplitude and variation of the RF signal input to the final gain stage of the power amplifier.

The first graph 1000 shows a constant RF amplitude of 125 mV has nearly 1.9 dB of forward power variation, which represents forward power detection of a power amplifier without the disclosed detectors at 1004 and with the disclosed detectors at 1006. A detector solution that relies solely on detecting RF amplitude at the input of the final gain stage of the power amplifier, such as the detector shown in FIG. 5, cannot improve on this variation. The variation of the final detector output voltage, $V_{DET[0]}$, is only 1.4 dB for the same RF amplitude when the disclosed detector is used with the power amplifier. Likewise, the second graph shows a constant RF output amplitude having an 8 dB forward power variation in which the output values of measured without disclosed detectors at 1008 and with the disclosed detectors at 1010. A detector that relied solely on detecting the RF amplitude at the output of the power amplifier, such as the detectors show in FIG. 4, suffers from excessive variation of detector voltage for constant forward power. Power detection of the power amplifier using the disclosed detectors provide significant performance advantages over other possible solutions.

Methods of detecting forward power in a detection circuit coupled to a power amplifier are also disclosed. Such methods can include coupling, in series, a first amplitude control circuit to an input of a gain stage of a power amplifier to produce a corrected input signal, coupling, in series, a second amplitude control circuit and a second phase control circuit to an output of the gain stage of the power amplifier to produce a corrected output signal, summing the corrected input signal and the corrected output signal to produce a summed node signal that is proportional to the forward power output of the power amplifier, and applying the summed node signal to the detection circuit to detect the forward power output. In this example, the summed node signal can be an RF signal having a power. The method can also include producing a DC output signal having a power that is proportional to the summed node signal power. This output signal can have a VSWR that is greater than zero. Detecting the summed node signal can be performed independently of the VSWR variations in an output signal of the power amplifier, as described above.

Having described and illustrated the principles of the invention in a preferred embodiment thereof, it should be apparent that the invention can be modified in arrangement and detail without departing from such principles. We claim all modifications and variations coming within the spirit and scope of the following claims.

The invention claimed is:

1. A power amplifier with power detection, comprising:
a radio frequency (RF) power amplifier having a gain stage that includes a gain stage input, a gain stage output, and a feedback loop coupled between an input and an output of the power amplifier;
a detection circuit having a first detection circuit input electrically coupled to the gain stage input and having a detection circuit output;
an amplitude control circuit and a phase control circuit electrically coupled together in series between the gain stage output and a second detection circuit input;
wherein the amplitude control circuit and the phase control circuit produce a signal received by the second detection circuit input so that the detection circuit detects a signal at the output of the detection circuit that has a power proportional to a forward power output of the power amplifier.

2. The power detection device of claim 1, wherein the amplitude control circuit is a first amplitude control circuit and further comprising a second amplitude control circuit that is electrically coupled in series between the first detection circuit input and the gain stage input.

3. The power detection device of claim 2, wherein the phase control circuit is a first phase control circuit and further comprising a second phase control circuit that is electrically coupled in series between the first amplitude control circuit and the first detection circuit input.

4. The power detection device of claim 3, wherein the output of the first phase control circuit and the output of the second phase control circuit are summed to produce a summed RF signal.

5. The power detection circuit of claim 1, wherein the gain stage output of the power amplifier exhibits a voltage standing wave ratio (VSWR) that is greater than one.

6. The power detection circuit of claim 1, wherein the power amplifier, the amplitude control circuit, the phase control circuit, and the detection circuit are each physically located together on an integrated circuit die.

7. A method of detecting forward power in a detection circuit coupled to a power amplifier, comprising:
coupling in series a first amplitude control circuit to an input of a gain stage of a power amplifier to produce a corrected input signal;
coupling in series a second amplitude control circuit and a second phase control circuit to an output of the gain stage of the power amplifier to produce a corrected output signal;
summing the corrected input signal and the corrected output signal to produce a summed node signal that is proportional to the forward power output of the power amplifier; and
applying the summed node signal to the detection circuit to detect the forward power output.

8. The method of claim 7, wherein the summed node signal is a radio frequency (RF) signal having a power and further comprising producing a direct current (DC) output signal having a power that is proportional to the summed node signal power.

9. The method of claim 7, further comprising coupling a first phase control circuit in series with the first amplitude control circuit between the gain stage input and the first amplitude control circuit.

10. The method of claim 7, wherein the output signal of the power amplifier has a voltage standing wave ratio that is greater than one.

11. The method of claim 7, wherein coupling a first amplitude control circuit to the input of the gain stage of the power amplifier, coupling the second amplitude control circuit and the second phase control circuit to the output of the gain stage of the power amplifier, and summing the corrected input signal and the corrected output signal occurs in parallel with a feedback loop of the gain stage of the power amplifier.

12. The method of claim 11, further comprising detecting the summed node signal independently of VSWR variations in an output signal of the power amplifier.

13. The method of claim 12, wherein coupling a first amplitude control circuit to an input of a gain stage of a power amplifier, coupling a second amplitude control circuit and a second phase control circuit to an output of the gain stage of the power amplifier, summing the corrected input signal and the corrected output signal to produce a summed node signal, and detecting the summed node signal all occur on the same integrated circuit die.

14. The method of claim 7, further comprising programming at least one of the first amplitude control circuit, the second amplitude control circuit, and the second phase control circuit in response to variations in power of an output signal of the power amplifier.

15. The method of claim 14, wherein the first amplitude control circuit, the second amplitude control circuit, and the second phase control circuit each include a blocking capacitor.

16. The method of claim 15, wherein the programming at least one of the first amplitude control circuit, the second amplitude control circuit, and the second phase control circuit includes adjusting the capacitance of the blocking capacitor.

17. The method of claim 7, wherein the detecting the summed node signal includes receiving the corrected input signal and the corrected output signal at an input of a detection circuit.

* * * * *